United States Patent
Ruengeler et al.

(10) Patent No.: US 10,422,846 B2
(45) Date of Patent: Sep. 24, 2019

(54) METHOD FOR CALIBRATING A RADIO FREQUENCY TEST INSTRUMENT AND RADIO FREQUENCY TEST INSTRUMENT

(71) Applicant: Rohde & Schwarz GmbH & Co. KG, Munich (DE)

(72) Inventors: Matthias Ruengeler, Markt Schwaben (DE); Gregor Feldhaus, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 15/419,869

(22) Filed: Jan. 30, 2017

(65) Prior Publication Data
US 2018/0217221 A1 Aug. 2, 2018

(51) Int. Cl.
*G01R 35/00* (2006.01)
*G01R 23/16* (2006.01)

(52) U.S. Cl.
CPC ............ *G01R 35/005* (2013.01); *G01R 23/16* (2013.01)

(58) Field of Classification Search
None
See application file for complete search history.

(56) References Cited

U.S. PATENT DOCUMENTS

| | | | | |
|---|---|---|---|---|
| 5,684,580 A * | 11/1997 | Cooper | ............... | G01N 21/65 356/301 |
| 6,700,537 B2 * | 3/2004 | Dufour | ............... | G01S 3/023 342/168 |
| 6,735,422 B1 * | 5/2004 | Baldwin | ............... | H03D 3/008 455/232.1 |
| 7,649,930 B2 | 1/2010 | He et al. | | |
| 7,720,137 B2 | 5/2010 | He et al. | | |
| 2002/0042256 A1 * | 4/2002 | Baldwin | ............... | H03D 3/008 455/232.1 |
| 2004/0219889 A1 * | 11/2004 | Honcharenko | ...... | H04B 1/0483 455/91 |
| 2007/0050154 A1 * | 3/2007 | Albahri | ................. | G01N 25/14 702/22 |

(Continued)

OTHER PUBLICATIONS

Maurice G. Cox, An Interpolation Scheme for Precision Intermediate Frequency Reflection Coefficient Measurement, IEEE Transactions on Instrumentation and Measurement, vol. 52, No. 1, Feb. 2003, pp. 27-37.*

*Primary Examiner* — Tung S Lau
(74) *Attorney, Agent, or Firm* — Schwabe, Williamson & Wyatt, P.C.

(57) ABSTRACT

A method for calibrating a radio frequency test instrument is described wherein a first frequency response is measured using a radio frequency and coarse intermediate frequency grid. A first matrix is created comprising data obtained from said first frequency response measuring. A second frequency response is measured using a radio frequency and fine intermediate frequency grid. A second matrix is created comprising data obtained from said second frequency response measuring. Said first matrix and said second matrix are processed and combined in order to determine a frequency response for a radio frequency desired, said first matrix and said second matrix comprising data obtained from measurements performed with different radio frequency and intermediate frequency grids. Further, a radio frequency test instrument is described.

20 Claims, 4 Drawing Sheets

(56) References Cited

U.S. PATENT DOCUMENTS

| | | | |
|---|---|---|---|
| 2009/0105966 A1* | 4/2009 | Brown | G01N 33/2823 |
| | | | 702/30 |
| 2010/0305872 A1* | 12/2010 | Abahri | G01N 33/28 |
| | | | 702/30 |
| 2012/0032854 A1* | 2/2012 | Bull | G01S 5/0215 |
| | | | 342/450 |
| 2012/0256789 A1* | 10/2012 | Bull | G01S 5/0221 |
| | | | 342/357.25 |

* cited by examiner

METHOD FOR CALIBRATING A RADIO FREQUENCY TEST INSTRUMENT AND RADIO FREQUENCY TEST INSTRUMENT

TECHNICAL FIELD

The invention relates to a method for calibrating a radio frequency test instrument and a radio frequency test instrument.

BACKGROUND OF THE INVENTION

It is known that a radio frequency test instrument, for instance a spectrum analyzer, shows hardware imperfection such as a frequency response being not perfectly flat.

The frequency response can be measured at the customer in the field using a so called "self-alignment" function or in the factory using a so called "factory calibration". Once the frequency response has been measured, it can be compensated during operation of the radio frequency test instrument by adjusting at least one filter appropriately which inverts the frequency response. For instance, an equalization filter is applied for compensating purposes. The goal is to have a very fine resolution for the equalization filters over the measurement bandwidth and a very good fitting equalization filter for the radio frequencies to be processed by the radio frequency test instrument.

The frequency response is influenced by an intermediate frequency part and a radio frequency part. Usually, the part of the frequency response originating from the radio frequency path of the analyzer is relatively flat within a bandwidth of 1 GHz, for instance. On the other hand this flat frequency response is superposed by a frequency response of the intermediate frequency with higher ripples over the corresponding bandwidth. However, both influences cannot be measured separately as they depend on each other. In addition, the resulting frequency response of the radio frequency test instrument can be separated in a so called fast influence and a so called slow influence for every single radio frequency tested.

In general, different methods are known to measure the amplitude of the frequency response to be used for calibrating the radio frequency test instrument.

For instance, a signal generator and a power meter are used. The signal generator transmits a single tone at a known frequency. The actual power of the tone is measured with the power meter in order to determine the frequency response. However, this measurement takes a long time for determining the frequency response for a high bandwidth.

Another method relates to the usage of an external comb generator that has to be calibrated initially for the different radio frequencies. However, the calibration takes some time and, further, a void calibration of said comb generator results in radio frequency test instruments being calibrated inappropriately. Particularly, factory calibrated radio frequency test instruments would have to be returned for recalibration purposes. In addition, a drifting of the comb generator over the time has to be taken into account while calibrating radio frequency test instruments.

Another method relates to an intermediate filter calculation as a fine frequency response measurement is performed such that the frequency response can be calculated with high accuracy for a few radio frequencies in order to set the equalization filter with regard to the determined frequency response. Then, a coarse frequency response measurement is performed while the equalization filters are set and applied. The frequency response is calculated again and the settings for the equalization filters are determined again. Afterwards, both settings for the equalization filters are combined and applied. However, the calibration time increases with the number of fine frequency response measurements performed, in particular the number of different radio frequencies used for the fine frequency response measurement. In addition, the fine and coarse measurement depend from each other resulting in a possible propagation of errors. Moreover, the equalization filters have to be set and applied for the coarse measurements which may also result in an additional error source.

Accordingly, there is a need for a method for calibrating a radio frequency test instrument that can be done fast, in a less complex manner and with a high accuracy.

SUMMARY OF THE INVENTION

The invention provides a method for calibrating a radio frequency test instrument, with the following steps:
a) Measuring a first frequency response using a radio frequency and coarse intermediate frequency grid;
b) Creating a first matrix comprising data obtained from said first frequency response measuring;
c) Measuring a second frequency response using a radio frequency and fine intermediate frequency grid;
d) Creating a second matrix comprising data obtained from said second frequency response measuring; and
e) Processing and combining said first matrix and said second matrix comprising data obtained from measurements performed with different radio frequency and intermediate frequency grids in order to determine a frequency response for a radio frequency desired.

Further, the invention provides a radio frequency test instrument being configured to perform a method as described above. Particularly, said radio frequency test instrument is at least one of a spectrum analyzer, an oscilloscope and any other suitable test instrument.

The invention is based on the finding that the calibration can be done fast and with high accuracy while performing two different measurements using different radio frequency and intermediate frequency grids, in particular with regard to the intermediate frequency grid. For instance, the first measurement relating to the first frequency response ensures a high absolute accuracy. However, the first measurement usually takes long as it provides a high absolute accuracy. Thus, the first measurement is done with a coarse intermediate frequency grid in order to reduce the total measurement time. In contrast thereto, the second measurement is done in a very fast manner such that a fine intermediate frequency grid can be used. However, the absolute accuracy of the second measurement is reduced with regard to the first measurement. The data obtained by these different measurements are combined with each other in order to use the information in a most efficient manner such that a frequency response with fine resolution is acquired for the radio frequency desired. The frequency response determined may be a very detailed one.

Particularly, the first frequency response measurement is done with a coarse radio frequency and coarse intermediate frequency grid whereas the second frequency response measurement is done with a fine radio frequency and fine intermediate frequency grid. Alternatively, the first frequency response measurement is done with a fine radio frequency and coarse intermediate frequency grid whereas the second frequency response measurement is done with a coarse radio frequency and fine intermediate frequency grid. The radio frequency grid applied depends on the radio frequency test instrument used. Accordingly, the grids for the first and second frequency response measurements are also called fine intermediate frequency grid and coarse intermediate frequency grid respectively in order to emphasize that the resolution of the radio frequencies during these measurements may be coarse or fine.

According to an aspect, for said radio frequency desired at least one of said first matrix and said second matrix is interpolated in the direction of said radio frequency desired. Generally, the matrices with representative points have to be very dense in order to get a complete representation of the frequency responses for all input frequencies within the required accuracy. However, that would result in a very long calibration cycle, both in factory calibration and in self alignment. To reduce the calibration time, the corresponding frequency response is interpolated from a less dense matrix which can be measured in a reasonable time. Generally, the user can select a certain radio frequency as the desired one wherein this radio frequency is used for interpolating the measurement points of the dedicated matrix. Particularly, the first matrix is interpolated in the direction of the radio frequency desired wherein the first matrix relates to the first frequency response measurement having a high accuracy, but reduced number of measurement values in order ensure that the first frequency response can be done in a reasonable time. Further, the interpolation in the direction of the radio frequency desired is done such that the grids of both matrices correspond to each other with regard to the direction of the radio frequency desired. This ensures that both matrices can be compared and combined easily, in particular with regard to the radio frequency desired. Particularly, no interpolation is necessary if the radio frequency desired is already part of the measured first matrix and/or the measured second matrix.

In addition, an adapted version of said second matrix may be generated comprising the measurement points corresponding to said radio frequency and coarse intermediate frequency grid. Accordingly, the second matrix relating to the radio frequency and fine intermediate frequency can be reduced such that a subsampled version is provided which relates to a virtual coarse measurement that can be used for comparing with the first matrix being measured in a coarse manner, in particular by using a coarse intermediate frequency grid. The subsampled version of the second matrix and the first matrix substantially have the same density with regard to the intermediate frequency direction. Accordingly, both matrices can be combined easily. Further, the adapted version can be obtained by interpolating the data of the second matrix from a fine grid to a coarse grid.

According to another aspect, said adapted version and said first matrix are processed in order to obtain a coarse difference matrix. For instance, the adapted version is subtracted from said first matrix with regard to the amplitudes in dB. If the amplitudes are in the linear domain, the first matrix is divided by said adapted version. This processing step provides a correcting factor, namely the coarse difference matrix, that can be applied to the second matrix having a reduced absolute accuracy for correcting purposes. Particularly, the coarse difference matrix is used to correct the absolute accuracy of the second matrix, in particular its different values. This correction can be done since the second frequency response measurement ensures a high relative accuracy such that the measurement points are correct in relation to each other. The difference matrix representing the correction factor provides a curve shape of the correction needed, in particular for correcting an additional unknown slope that occurs due to the measurement. This unknown slope may combine with the slow influence on the frequency response of the test instrument during the fast and fine second frequency response measurement.

Particularly, data points of said coarse difference matrix are interpolated to obtain a fine difference matrix, said fine difference matrix comprising data points corresponding to said grid of the second matrix, in particular to said radio frequency and fine intermediate frequency grid. This ensures that a complete set of information is provided that can be used for the incorrect slow correction, in particular the slow correction and the unknown slope occurring during the second measurement. The fine difference matrix has the same density as the second matrix as both have the same grid with regard to the intermediate frequency. The interpolation of the difference matrix is done in intermediate frequency direction. Thus, the difference matrix corresponds to the intermediate frequency grid of the second matrix.

Said fine difference matrix may be combined with said second matrix such that the frequency response for said radio frequency desired is determined. Accordingly, the measured fine data having a reduced absolute accuracy are corrected with regard to their absolute accuracy while using the fine difference matrix. The incorrect slope is corrected appropriately, in particular the slow influence and the unknown slope that occurs during the second frequency response measurement.

Another aspect provides that said second matrix is corrected by compensating an incorrect slope resulting from imperfect frequency response, in particular imperfect comb frequency response measurement. The reduced absolute accuracy of the data obtained by the second measurement is corrected since the unknown slope causing the reduced absolute accuracy is determined and compensated appropriately. The incorrect slope to be compensated corresponds to the slow influence of the test instrument and the unknown slope that occurs due to the second frequency response measurement.

According to an embodiment, a model of the hardware of said radio frequency test instrument is used for interpolating. The usage of the model ensures that fewer measurement points are needed to get the same accuracy. Therefore, the measurement time can be reduced while maintaining the absolute accuracy.

Further, a model of the influence of the frequency may be used for interpolating. This model also ensures that fewer measurement points are needed to get the same accuracy.

Generally, a higher accuracy may be obtained in the same time or the same accuracy may be obtained in shorter time.

According to an embodiment, said first frequency response is done by using a power meter. A power meter typically provides measurement data with a high absolute accuracy. However, as the measurement done with the power meter takes long, a coarse grid is used in order to reduce the total measurement time. The measurement points in the radio frequency and coarse intermediate frequency grid have a high absolute accuracy.

Said second frequency response measurement may be performed with a modulated signal, said modulated signal spanning said specified bandwidth. This ensures that several intermediate frequencies are stimulated at once. Accordingly, such a modulated signal is suitable for the second frequency response measurement with the radio frequency and fine intermediate frequency grid.

Another aspect provides that said second frequency response measurement is done by using a comb generator. A comb generator can be used as it generates a comb signal that also stimulates several intermediate frequencies at once. Thus, the comb generator is suitable for the second measurement.

Particularly, a comb signal is mixed up to a radio frequency signal having a desired frequency by using said comb generator. The comb generator may have a built-in mixer wherein a broadband comb signal is generated that is shifted to the complete frequency range of the radio frequency test instrument. Thus, the comb signal generated by the comb generator is mixed up for higher frequencies.

According to an aspect, said second frequency response measurement is done by using a signal generation unit being configured to generate a continuous wave signal, a multi-carrier signal or a multi-tone signal. These different signals are also suitable for stimulating several intermediate frequencies at once such that a short measurement time for the second frequency response measurement is needed.

Particularly, said continuous wave signal is at least one of a stepped continuous wave signal, a perfect swept continuous wave signal and a normal swept continuous wave signal. These different signals ensure a fast measurement wherein several intermediate frequencies are stimulated simultaneously or in a fast sequence. For instance, the capture length is longer than the sweep time of the swept signal ensuring that the captured signal comprises all frequencies. Thus, these signals are suitable for providing measuring data used to create the fine radio frequency and fine intermediate frequency grid.

According to an embodiment, said radio frequency and fine intermediate frequency grid comprises only one radio frequency. If the influence of the intermediate frequency is independent of the radio frequency, just one fine measurement at a certain radio frequency is necessary. That reduces the total measurement time significantly.

Alternatively, the radio frequency and fine intermediate frequency grid may comprise only a few radio frequencies, for instance two. This might be helpful provided that an analog frontend is switched wherein the influence of the intermediate frequency part changes.

Generally, the number of radio frequencies used for the matrix provided by the fine intermediate frequency grid can be reduced appropriately.

Moreover, said second frequency response measurement may be performed with a perfect sequence. This sequence can be used instead of a comb signal in order to stimulate several intermediate frequencies.

Another aspect provides that an equalization filter is set based on said frequency response determined, in particular wherein said equalization filter set is applied. After having determined the frequency response for the desired frequency, the equalization filters are set appropriately in order to compensate the frequency response that will occur during operation of the radio frequency test instrument.

Further, the first and second frequency response measurements may be done different based on the radio frequency region selected. Thus, different methods can be applied for the first and second frequency response measurements in different radio frequency regions. Accordingly, the user can select a certain method to be applied. Particularly, the radio frequency grid is adjusted appropriately based on the selection, for instance a fine radio frequency grid for a first radio frequency region and a coarse radio frequency grid for a second radio frequency region.

BRIEF DESCRIPTION OF DRAWINGS

The invention will now be described with reference to an exemplary embodiment that is shown in the drawings. In the drawings, FIG. 1 schematically shows a radio frequency test instrument according to the invention.

DETAILED DESCRIPTION OF EXAMPLE EMBODIMENT

Figure 1:
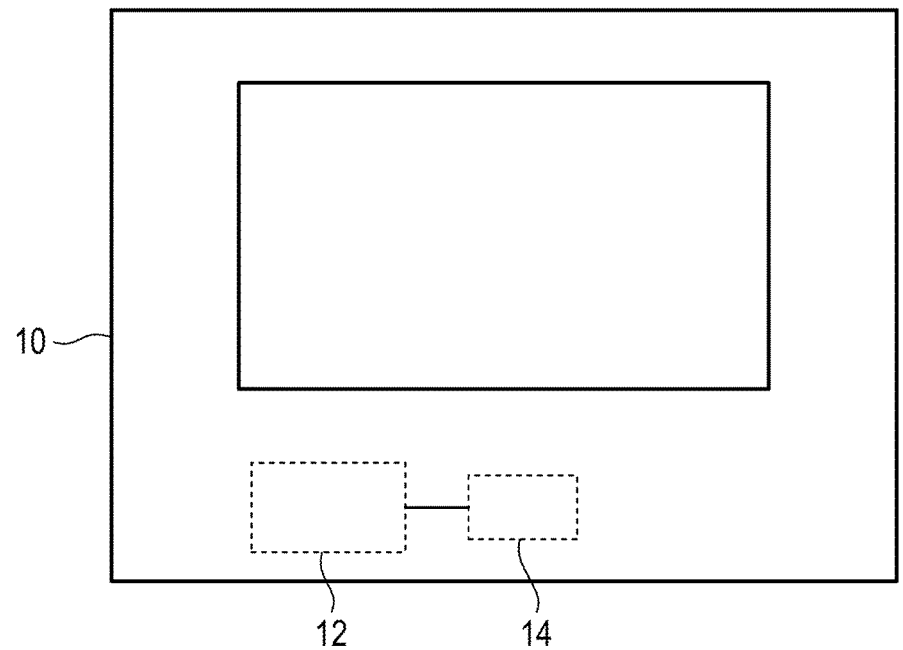

In FIG. 1, a radio frequency test instrument 10 is shown that is used for measuring and analyzing radio frequency signals. The radio frequency test instrument 10 typically has a specified bandwidth than can be used during operation. Particularly, the radio frequency test instrument 10 is established by a spectrum analyzer.

The radio frequency test instrument 10 comprises a processing unit 12 and a data storage 14 which are connected with each other for exchanging data. The processing unit 12 is configured to perform a method for calibrating the radio frequency test instrument 10 that is described hereinafter.

The method for calibrating the radio frequency test instrument 10 comprises a first step wherein a first frequency response is measured while using a radio frequency and coarse intermediate frequency grid. The data obtained from this first measurement are used to create a first matrix. In addition, the method for calibrating the radio frequency test instrument 10 comprises another step wherein a second frequency response is measured while using a radio frequency and fine intermediate frequency grid. Again, a second matrix is created by the data obtained from this second measurement.

In the shown embodiments, the first frequency response is measured with a coarse radio frequency and coarse intermediate frequency grid whereas the second frequency response is measured with a fine radio frequency and fine intermediate frequency grid. However, the radio frequencies grid can be different with regard to the radio frequencies.

Figure 2:
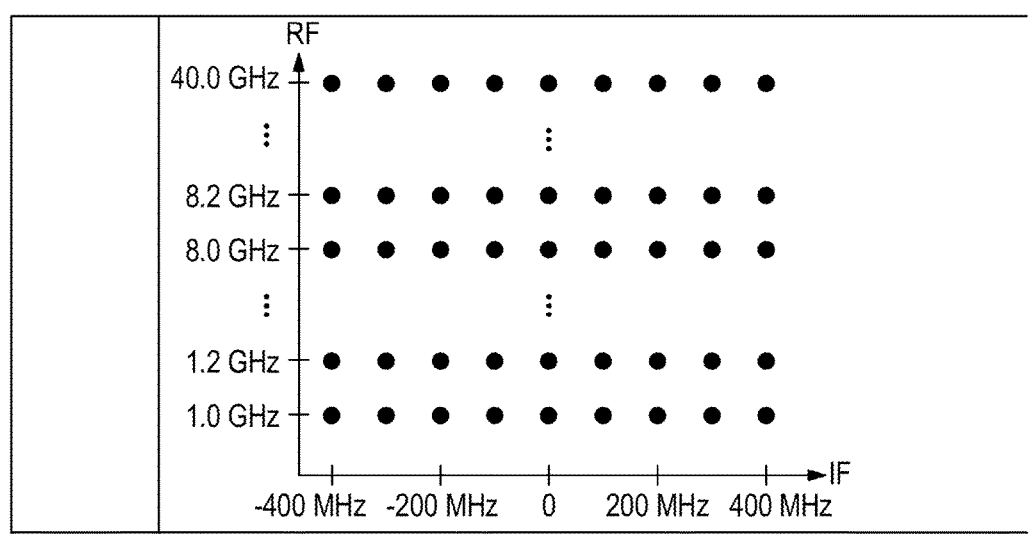
FIG. 2 shows a diagram representing calibration points used in a calibrating method of the test and measuring device according to the invention.

In FIG. 2, such a matrix is shown for illustrating purposes. The matrix comprises several calibration points in intermediate frequency (x axis) and in radio frequency (y axis). All these calibration points may comprise amplitude and/or phase information. The matrices created by the first and second frequency response measurements are stored in the data storage 14 for further processing. The calibration points may also be called measurement points as they have been measured directly.

Generally, the matrices have to be very dense in order to get a complete representation of the frequency response for all input frequencies within the required accuracy. However, this would result in a very long calibration cycle, both in factory calibration and in self alignment. Thus, the calibration time is reduced by using the first measurement wherein the frequency response is measured using a coarse radio frequency and coarse intermediate frequency grid.

This first measurement is done with a power meter, for instance. This ensures that the absolute accuracy of the different measurement points is very high. However, the density of the first matrix is not as high as needed. Thus, the first matrix is interpolated in direction of the radio frequency desired in order to increase the density at least partly. Thus, the processing time is reduced. This radio frequency desired corresponds to a radio frequency that is selected by the user of the radio frequency test instrument 10.

Moreover, the second matrix representing the second measurement with the (fine) radio frequency and fine intermediate frequency grid has a high density with respect to the original first matrix, in particular prior to its interpolation in the direction of the radio frequency desired. However, the second matrix can also be interpolated in the direction of the radio frequency desired in order to increase the density of the second matrix as well at least partly in short time.

Generally, the first and second matrices have the same density with regard to the radio frequency desired after interpolating the first matrix and optionally interpolating the second matrix in the direction of the radio frequency desired. This ensures that both matrices can be compared and combined easily during further processing as will be described later, in particular with regard to the radio frequency desired.

Figure 3:
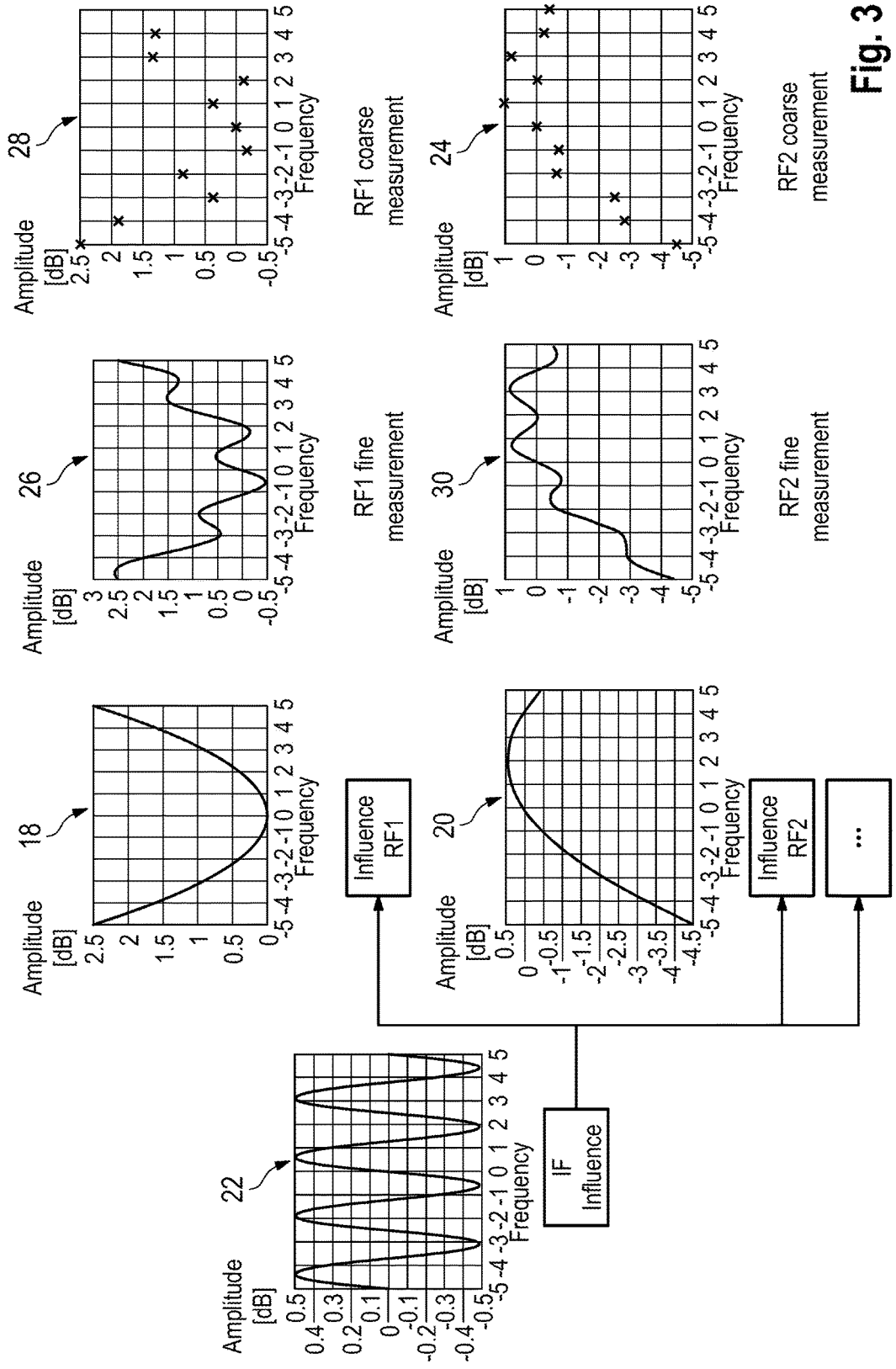
FIG. 3 shows an overview of the influences of frequency response and different measurements performed in a calibrating method of the test and measuring device according to a first embodiment of the invention.

In the left portion of FIG. 3, the influences on the frequency response of the radio frequency part 18, 20 are illustrated for two different radio frequencies RF1 and RF2. Further, the influence of the intermediate frequency part 22 is shown that is substantially fixed for the different radio frequencies. In general, the frequency response of the intermediate frequency part may have more ripples than the frequency of the radio frequency part. However, both influences, e.g. the radio frequency part and the intermediate frequency part, cannot be measured separately.

In the right portion of FIG. 3, a first frequency response measurement 24 for the second radio frequency RF2 is shown wherein a coarse radio frequency and coarse intermediate frequency grid has been used. Thus, only several distributed measurement points are shown in the corresponding diagram. However, a fine radio frequency and coarse intermediate frequency grid could also be used.

In addition, a second frequency response measurement 26 is shown wherein a fine radio frequency and fine intermediate frequency grid has been used. This second measurement 26 relates to the first radio frequency RF1. However, a coarse radio frequency and fine intermediate frequency grid could also be used.

As already mentioned above, the second frequency response measurement 26 with the (fine) radio frequency and fine intermediate frequency grid as well as the first frequency response measurement 24 can be interpolated in the direction of the radio frequency desired in order to obtain the diagrams shown in FIG. 3.

For both measurements 24, 26, the combined influences of the intermediate frequency part 22 and the dedicated radio frequency part 18, 20 are captured.

The second frequency response measurement 26 (RF1 fine measurement) can be adapted such that an adapted version 28 of the second matrix is provided, for instance a subsampled version while subsampling the second matrix. This adapted version 28 has a reduced density with regard to the intermediate frequency wherein the reduced density relates to the one of the first matrix obtained by the first frequency response measurement 24 with the (coarse) radio frequency and coarse intermediate frequency grid. This adapted version 28 corresponds to a matrix obtained by using a coarse radio frequency and coarse intermediate frequency grid. Thus, the adapted version 28 can be deemed as a virtual coarse measurement. In FIG. 3, the adapted version 28 is also labeled as RF1 coarse measurement.

The grids of the matrices relating to the adapted version 28 and the first frequency response measurement 24 are similar such that both matrices can be compared and combined.

As will be described later, the first frequency response measurement 24 and the second frequency response measurement 26 are processed and combined such that the fine frequency response for a radio frequency desired can be obtained with high accuracy in reasonable time.

For instance, diagram 30 shown in FIG. 3 represents the desired fine frequency response wherein it corresponds to a fine frequency response for the radio frequency that has been measured in a coarse manner, initially. The diagram 30 is derived from the first frequency response measurement 24 being coarse and the second frequency response measurement 26 being fine.

Generally, the first frequency response measurement 24 with a (coarse) radio frequency and coarse intermediate frequency grid will be performed for each useable radio frequency despite the first radio frequency RF1 that has been used for the second frequency response measurement 26 with fine grid. As already mentioned, the first frequency response measurement 24 is very fast such that the whole measurement time is reduced.

Figure 4:
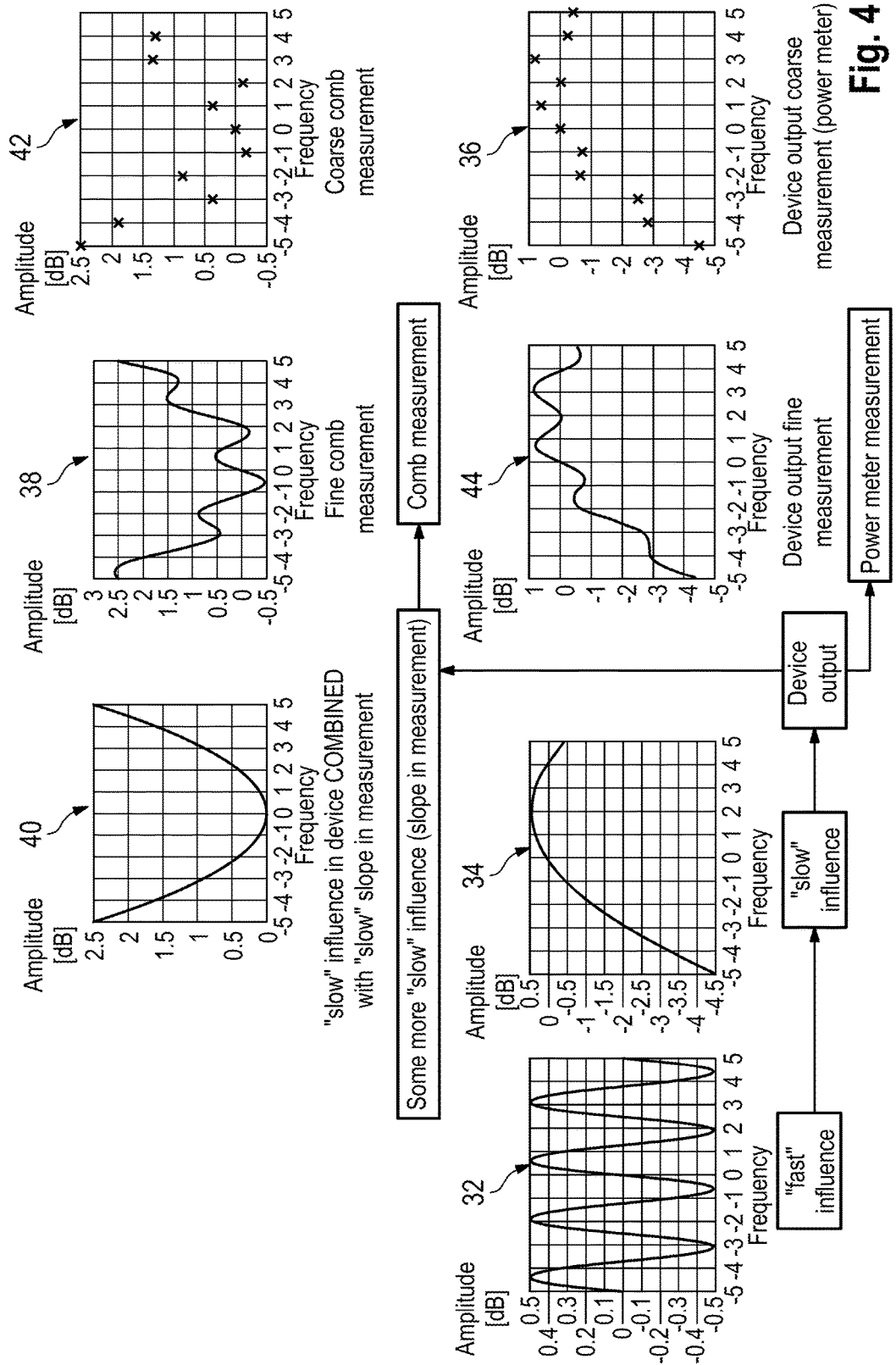
FIG. 4 shows an overview of the influences of frequency response and different measurements performed in a calibrating method of the test and measuring device according to a second embodiment of the invention.

In FIG. 4 it is shown that the frequency responses of the radio frequency test instrument 10 have for each radio frequency a "fast" influence 32 and a "slow" influence 34.

In addition, FIG. 4 shows a similar situation with regard to FIG. 3 wherein a first measurement 36 with a coarse radio frequency and coarse intermediate frequency grid is performed while using a power meter. Thus, the measurement time is reduced wherein the absolute accuracy of the measured points is high. However, a fine radio frequency and coarse intermediate frequency grid can also be used.

In addition, a second measurement 38 with a fine radio frequency and fine intermediate frequency grid is done while using a comb generator. The comb generator generates a comb signal that is mixed up to a radio frequency signal having a desired frequency. However, a coarse radio frequency and fine intermediate frequency grid can also be used.

The comb measurement, e.g. the second measurement 38, provides data on a very fine grid as several intermediate frequencies are stimulated simultaneously. However, an additional unknown slope occurs due the second measurement 38 performed by the comb generator. This additional unknown slope of the measurement combines with the slow influence 34 of the test instrument 10 such that a combined incorrect slope 40 occurs influencing the second measurement 38 in an unknown manner as shown in FIG. 4.

The incorrect slope 40 results in a reduced accuracy with regard to the absolute values measured by the second measurement 38. Nevertheless, the relative values of the comb measurement, e.g. the second measurement 38, are accurate.

Both, the coarse power meter measurement 36 and the comb measurement 38 are conducted for several radio frequencies.

The first and second measurements 36, 38 also provide data used to create a first matrix and a second matrix that can be interpolated in the direction of the radio frequency desired as already discussed with regard to FIG. 3.

Further, an adapted version 42 of the second frequency response measurement 38 is also obtained that is additionally labeled as a coarse comb measurement. Further, a desired frequency response 44 to be obtained is also shown in FIG. 4 that can be calculated as described hereinafter.

Figure 5:
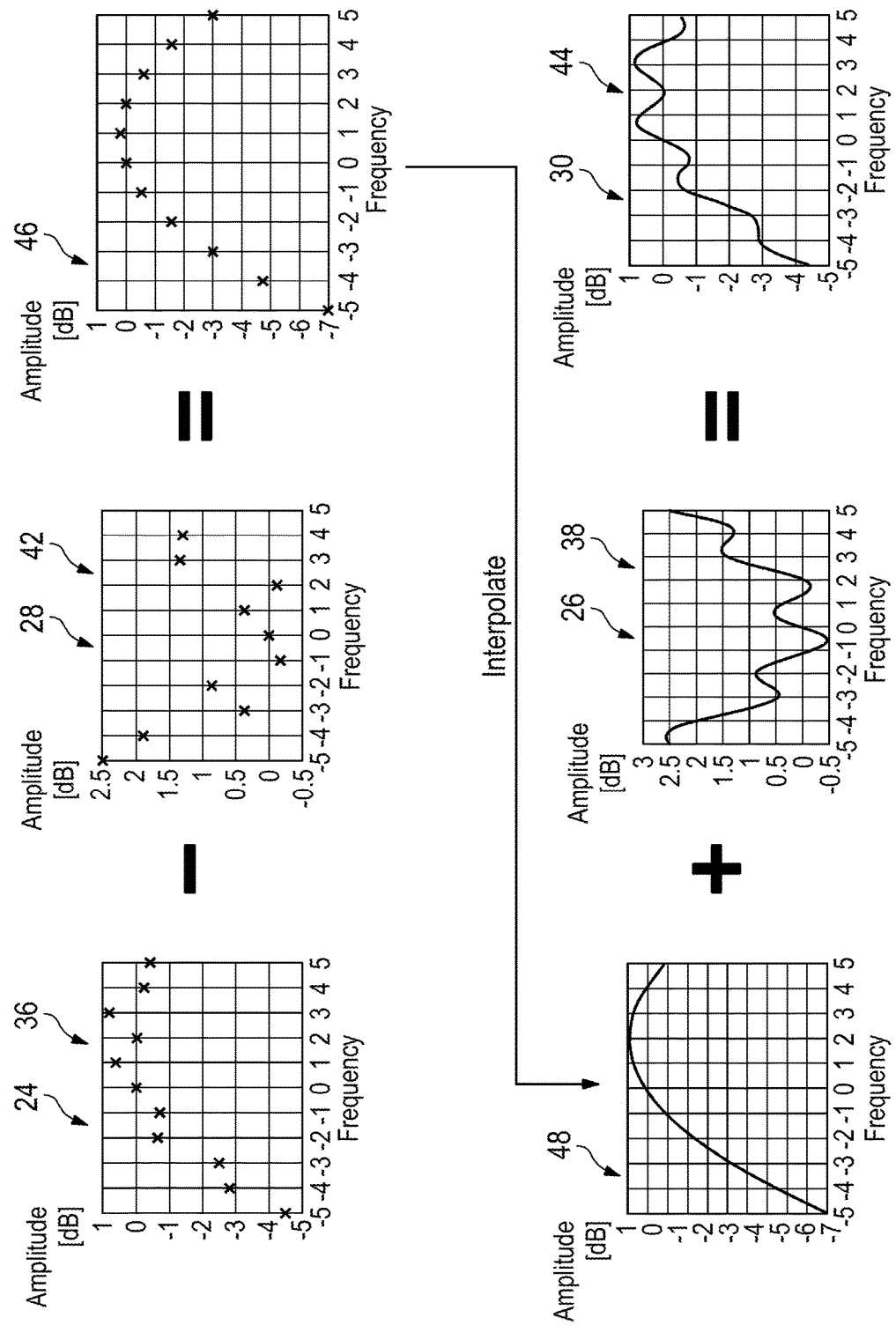
FIG. 5 shows an overview of correcting the second measurement done in a calibrating method of the test and measuring device according to the invention.

The desired frequency responses 30 (FIG. 3) and 44 (FIG. 4) can be obtained by the combining technique that is shown in FIG. 5 and described hereinafter.

FIG. 5 refers to the signals used for the different measurements as shown in FIGS. 3 and 4.

As already described, the matrix of the second frequency response measurement 26, 38 can be reduced such that the adapted version 28, 42 is generated having a similar intermediate frequency grid with regard to the first matrix representing the first frequency response measurement 24, 36.

Then, this adapted version 28, 42 is subtracted from the first matrix relating to the first frequency response measurement 24, 36 such that a coarse difference matrix 46 is obtained.

The data points of this coarse difference matrix 46 are interpolated in intermediate frequency direction in order to create a fine difference matrix 48 having a fine grid with regard to the intermediate frequency. The fine difference matrix 48 comprises the same radio frequency and intermediate frequency grid as the second matrix relating to the second frequency response measurement 26, 38.

Then, the fine difference matrix 48 and the second matrix relating to the second frequency response measurement 26, 38 are combined such that the frequency response for the radio frequency desired is obtained with high accuracy. This frequency response corresponds to the desired frequency response 30, 44 shown in FIGS. 3 and 4.

If another radio frequency is the desired one, the difference matrix 46 is generated by using the coarse matrix measured of the radio frequency desired.

The coarse difference matrix 46 and the fine difference matrix 48 are used to correct the second matrix related to the second frequency response measurement 26, 38 as the incorrect slope is compensated, in particular the unknown slope that occurs during the second measurement.

For the different interpolating steps, a first model of the hardware of the test instrument 10 can be applied. Accordingly, the number of measuring points can be reduced resulting in a faster measurement.

Alternatively or supplementary, a second model of the influence of the frequency is used for the different interpolating steps. This second model also ensures that the number of measuring points required can be reduced for maintaining the desired accuracy. Thus, the measurement time can be reduced again.

In general, the frequency response measurements with fine intermediate frequency grid may be performed with a modulated signal that spans the bandwidth specified by the radio frequency test instrument 10.

Particularly, said second frequency response measurement may be performed with a perfect sequence instead of a comb signal.

For instance, the second frequency response measurement 26 is measured by using a signal generation unit that is configured to generate a continuous wave signal, a multi-carrier signal or a multi-tone signal. For instance, the continuous wave signal is at least one of a stepped continuous wave signal, a perfect swept continuous wave signal and a normal swept continuous wave signal. These different signals ensure that several intermediate frequencies can be stimulated simultaneously or in a fast sequence as the capture length is longer than the sweep time.

Generally, a coarse measurement and a fine measurement are conducted with regard to the intermediate frequency.

In FIG. 3, the fine measurement refers to the RF1 fine measurement and the coarse measurement to the RF2 coarse measurement.

In FIG. 4, the fine measurement refers to the comb measurement and the coarse measurement to the power meter measurement.

The steps described with regard to FIG. 5 can be applied for both different cases as described above.

Afterwards, the fine frequency response for the radio frequency desired is obtained that can be used for setting an equalization filter.

This equalization filter set is applied during the operation of the radio frequency test instrument 10 such that the calibration of the radio frequency test instrument 10 is done quickly.

The accuracy is improved while the calibration time is maintained. Moreover, the calibration is less complex which reduces the risk of failure.

Moreover, the first and second frequency response measurements 24, 26, 36, 38 may be done different based on the radio frequency region selected at the radio frequency test instrument 10. The user selects a certain radio frequency region wherein the radio frequency grid of the first and second frequency response measurements 24, 26, 36, 38 is adjusted appropriately based on the selection. For instance, a fine radio frequency grid is used for a first radio frequency region whereas a coarse radio frequency grid is used for a second radio frequency region.

The invention claimed is:

1. A radio frequency test instrument configured to measure and/or analyze radio frequency signals, the radio frequency test instrument including a hardware processor device to carry out the steps of:
using a signal generation unit to generate a first radio frequency and a second radio frequency;
measuring, with the processing device, a first frequency response using the first radio frequency and coarse intermediate frequency grid;
creating, with the processing device, a first matrix comprising data obtained from said first frequency response measuring, said first matrix comprising multiple calibration points for at least one intermediate frequency and at least one radio frequency;
measuring, with the processing device, a second frequency response using the second radio frequency and fine intermediate frequency grid, wherein the fine intermediate frequency grid includes a higher density of measurement points than the coarse intermediate frequency grid, and the second frequency response has an absolute accuracy that is reduced with regard to the radio frequency and coarse intermediate frequency grid;
creating, with the processing device, a second matrix comprising data obtained from said second frequency response measuring, said second matrix comprising multiple calibration points for the intermediate frequency and the radio frequency;
interpolating, with the processing device, data in one of said first and second matrix in a direction of a selected radio frequency;
processing and combining, with the processing device, said first matrix and said second matrix comprising the data and interpolated data obtained from measurements performed with different radio frequencies and intermediate frequency grids in order to reduce the time required to determine a frequency response of the radio frequency test instrument for the selected radio frequency; and calibrating, with the processing device, the radio frequency test instrument based on the frequency response of the radio frequency test instrument determined from the first and second matrix.

2. The radio frequency test instrument according to claim 1, wherein for said selected radio frequency at least one of said first matrix and said second matrix is interpolated in the direction of said selected radio frequency.

3. The radio frequency test instrument according to claim 1, wherein an adapted version of said second matrix is generated comprising the measurement points corresponding to said coarse intermediate frequency grid.

4. The radio frequency test instrument according to claim 3, wherein said adapted version and said first matrix are processed in order to obtain a coarse difference matrix.

5. The radio frequency test instrument according to claim 4, wherein data points of said coarse difference matrix are interpolated to obtain a fine difference matrix, said fine difference matrix comprising data points corresponding to said grid of the second matrix.

6. The radio frequency test instrument according to claim 5, wherein said fine difference matrix is combined with said second matrix such that the frequency response for said selected radio frequency is determined.

7. The radio frequency test instrument according to claim 1, wherein said second matrix is corrected by compensating a slope resulting from the frequency response, in particular imperfect comb frequency response measurement.

8. The radio frequency test instrument according to claim 1, wherein a model of the hardware of said radio frequency test instrument is used for interpolating.

9. The radio frequency test instrument according to claim 1, wherein a model of the influence of the frequency is used for interpolating.

10. The radio frequency test instrument according to claim 1, wherein said first frequency response is done by using a power meter.

11. The radio frequency test instrument according to claim 1, wherein said second frequency response measurement is performed with a modulated signal, said modulated signal spanning said specified bandwidth.

12. The radio frequency test instrument according to claim 1, wherein said second frequency response measurement is done by using a comb generator.

13. The radio frequency test instrument according to claim 12, wherein a comb signal is mixed up to a radio frequency signal having a selected frequency by using said comb generator.

14. The radio frequency test instrument according to claim 1, wherein said second frequency response measurement is done by using a signal generation unit being configured to generate a continuous wave signal, a multi-carrier signal or a multi-tone signal.

15. The radio frequency test instrument according to claim 14, wherein said continuous wave signal is at least one of a stepped continuous wave signal, a perfect swept continuous wave signal and a normal swept continuous wave signal.

16. The radio frequency test instrument according to claim 1, wherein said radio frequency and fine intermediate frequency grid comprises only one radio frequency.

17. The radio frequency test instrument according to claim 1, wherein said second frequency response measurement is performed with a perfect sequence.

18. The radio frequency test instrument according to claim 1, wherein an equalization filter is set based on said frequency determined, in particular wherein said equalization filter set is applied.

19. The radio frequency test instrument according to claim 1, wherein the first and second frequency response measurements are done different based on the radio frequency region selected.

20. The radio frequency test instrument according to claim 1, wherein said radio frequency test instrument is at least one of a spectrum analyzer and an oscilloscope.

* * * * *